United States Patent
Komiya et al.

(10) Patent No.: US 6,501,448 B1
(45) Date of Patent: Dec. 31, 2002

(54) ELECTROLUMINESCENCE DISPLAY DEVICE WITH IMPROVED DRIVING TRANSISTOR STRUCTURE

(75) Inventors: Naoaki Komiya, Ohgaki (JP); Tsutomu Yamada, Motosu-gun (JP); Kiyoshi Yoneda, Motosu-gun (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/493,893

(22) Filed: Jan. 28, 2000

(30) Foreign Application Priority Data

Jan. 29, 1999 (JP) .............................. 11-022184

(51) Int. Cl.[7] .................................................. G09G 3/30
(52) U.S. Cl. .............................. 345/80; 362/84; 345/76; 315/169.1; 315/169.3
(58) Field of Search ...................... 362/84; 315/169.1, 315/169.3; 345/76, 80

(56) References Cited

U.S. PATENT DOCUMENTS

| | | | | |
|---|---|---|---|---|
| 3,885,196 A | * | 5/1975 | Fischer | 313/498 |
| 4,110,664 A | * | 8/1978 | Asars et al. | 340/825.68 |
| 5,095,248 A | * | 3/1992 | Sato | 315/169.3 |
| 5,616,936 A | * | 4/1997 | Misawa et al. | 257/72 |
| 5,670,792 A | * | 9/1997 | Utsugi et al. | 257/40 |
| 5,786,796 A | * | 7/1998 | Takayama et al. | 315/169.3 |
| 6,188,375 B1 | * | 2/2001 | Kagey | 345/76 |
| 6,246,384 B1 | * | 6/2001 | Sano | 315/169.3 |

* cited by examiner

*Primary Examiner*—Sandra O'Shea
*Assistant Examiner*—Ismael Negron
(74) *Attorney, Agent, or Firm*—Cantor Colburn LLP

(57) ABSTRACT

An organic EL display device comprises a first TFT (30), which is a switching TFT, an organic EL element driving TFT, and an organic EL element (60) having an anode (61), a cathode (66), and an emissive element layer (65) interposed between both electrodes. The EL element driving TFT comprises a second and third TFTs (35, 40) connected in parallel. Because electrical current to the organic EL element (60) is supplied from a plurality of TFTs (35, 40), variation in the total current value can be suppressed to therefore reduce the variation in luminance, even when characteristics vary among the TFTs driving the organic EL element.

14 Claims, 6 Drawing Sheets

ELECTROLUMINESCENCE DISPLAY DEVICE WITH IMPROVED DRIVING TRANSISTOR STRUCTURE

BACKGROUND OF THE INVENTION

1. Field of the Invention

The present invention relates to an electroluminescence display device comprising an electroluminescence element and thin film transistors.

2. Description of Related Art

An electroluminescence (EL) display devices using an electroluminescence element have recently attracted interest as potential replacements for devices such as CRT or LCD displays. For example, an EL display device having a thin film transistor (TFT) as a switching element for driving the EL element has been studied and developed.

FIG. 1 shows an equivalent circuit diagram of an organic EL display device comprising an EL element and TFTs according to a related art. The organic EL display device is shown in a plan view in FIG. 2 and in cross sections taken along line A—A in FIG. 3A and along line B—B in FIG. 3B, respectively.

The circuit in FIG. 1 comprises a first TFT 130, a second TFT 140, and an organic EL element 160. Shown in the figure is a region around where a gate signal line Gn in the n-th row is orthogonal to a drain signal line Dm in the m-th column, and in the vicinity of the cross section of both signal lines are provided the organic EL element 160, and the TFTs 130, 140 for driving the organic EL element 160.

The first TFT 130, which is a switching TFT, comprises gate electrodes 131 connected to the gate signal line Gn and having a gate signal supplied thereto, a drain electrode 132 connected to the drain signal line Dm and having a drain signal supplied thereto, and a source electrode 133 connected to a gate electrode 141 of the second TFT 140.

The second TFT 140, which is an organic EL element driving TFT, comprises a gate electrode 141 connected to the source electrode 133 of the first TFT 130, a source electrode 142 connected to an anode 161 of the organic EL element 160, and a drain electrode 143 connected to a power supply 150 for the organic EL element 160.

The organic EL element 160 comprises the anode 161 connected to the source electrode 142 of the second TFT 140, a cathode 162 connected to a common electrode 164, and an emissive element layer 163 interposed between the anode 161 and the cathode 162.

A capacitor 170 is further provided with one electrode 171 being connected between the source electrode 133 of the first TFT 130 and the gate electrode 141 of the second TFT 140 while the other electrode 172 being connected to the common power supply 150.

When a gate signal is applied to the gates 131 of the first TFT 130, a drain signal is applied from the drain 132 to the source 133 and is further applied to the storage capacitor 170 and the gate 141 of the second TFT 140.

When a voltage is applied to the gate 141, an electrical current in accordance with the voltage is supplied from the power supply 150 to the organic EL element 160 which then emits light.

In the conventional EL display device as described above, the characteristics of the TFT 140 for supplying a current to drive the organic EL element 160 vary in each display pixel. For example, if the second TFT 140 has an active layer comprising a polycrystalline semiconductor layer formed by irradiating a laser to an amorphous semiconductor layer, the laser light is not uniformly irradiated in the channel region of each semiconductor layer. As a result, the grain size of is crystal in the semiconductor layers becomes non-uniform, and the characteristics, such as on-state current, vary.

If the characteristics vary in the second TFT comprising a single TFT as described above, the current values to be supplied to the organic EL element 160 also vary in each display pixel, which in turn leads to non-uniform luminance of the display pixels.

SUMMARY OF THE INVENTION

The present invention is made in view of the aforementioned problems of the related art and aims to provide an EL display device which can achieve display with uniform luminance in each display pixel, even if the characteristics of TFTs vary in the display pixels for driving the EL element.

In one aspect of the present invention, there is provided an electroluminescence (EL) display device comprising an EL element having an anode, a cathode, and an emissive layer interposed between the anode and the cathode; a first transistor formed by a thin film transistor in which a drain of an active layer using a non-single crystal semiconductor film is connected to a drain signal line and gate electrodes provided above or under channels of said active layer are connected to a gate signal line; and a second transistor formed by a plurality of thin film transistors in each of which a drain of an active layer using a non-single crystal semiconductor film is connected to a drive souse of said EL element and gate electrodes are respectively connected in parallel with the source of the first thin film transistor.

In accordance with another aspect of the present invention, there is provided an electroluminescence device comprising an EL element having first and second electrodes and an emissive layer provided between the first and second electrodes; a switching thin film transistor which operates when a gate thereof receives a gate signal and captures a data signal; and an element driving thin film transistor provided between a power supply and the EL element for controlling power supplied from the power supply to the EL element according to the data signal supplied from the switching thin film transistor, said element driving thin film transistor being constituted by a plurality of thin film transistors connected in parallel to each other.

As described above, a plurality of thin film transistors are connected in parallel for supplying power from the power source to drive the EL element, such that the effects of variance in the characteristics of each of the thin film transistors upon the entire characteristics for the set of thin film transistors can be reduced, even when the characteristics vary in individual transistors. Thus, electrical power can be stably supplied by the plurality of thin film transistors to the EL element which generates luminance depending on the power amount (current amount) supplied from the power source, thereby suppressing the variance in luminance of the EL element.

When said EL element, and said switching (first) and element driving (second) thin film transistors constitute one pixel, and a display device is comprised of a plurality of pixels arranged in matrix on a substrate, the present invention can effectively prevent the luminance from varying in each pixel to achieve uniform display.

In accordance with another aspect of the present invention, the active layer of each thin film transistor of the first and second transistors or the active layer in each of the switching thin film transistor and the element driving thin film transistor comprises a non-single crystal semiconductor layer.

The non-single crystal semiconductor layer may be, for example, a polysilicon layer.

Further, in accordance with still another aspect of the present invention, the active layers in respective thin film transistors of the first and second transistors or the active layers in the switching thin film transistor and the element driving thin film transistor are non-single crystal semiconductor layers formed in the same process step.

By forming the active layers of these transistors in the same process, no extra process steps are required, even if a structure is adopted in which a plurality of thin film transistors constituting the element driving thin film transistor are connected in parallel.

In accordance with another aspect of the present invention, a storage capacitor is further provided between the source of the switching thin film transistor and each gate of a plurality of thin film transistors constituting the element driving one thin film transistor.

The storage capacitor simplifies the holding of data obtained when the switching thin film transistor, which is selected every predetermined period, is selected, until next time the switching thin film transistor is selected, thereby improving the display quality of the display device.

In accordance with still another aspect of the present invention, the electroluminescence element is an organic electroluminescence element having an emissive layer which uses an organic compound.

An emissive layer using an organic compound is very advantageous in a color display device due to the variation of emissive colors and a wide selection of possible materials.

In accordance with another aspect of the present invention, the switching and element driving thin film transistors have a top gate or bottom gate structure in which the gate electrodes are disposed above or under the active layer of each transistor.

In accordance with still another aspect of the present invention, the switching thin film transistor has a Lightly Doped Drain structure and/or multigate structure. Such a structure will allow improved rapid response and reduced leak current at the off mode.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
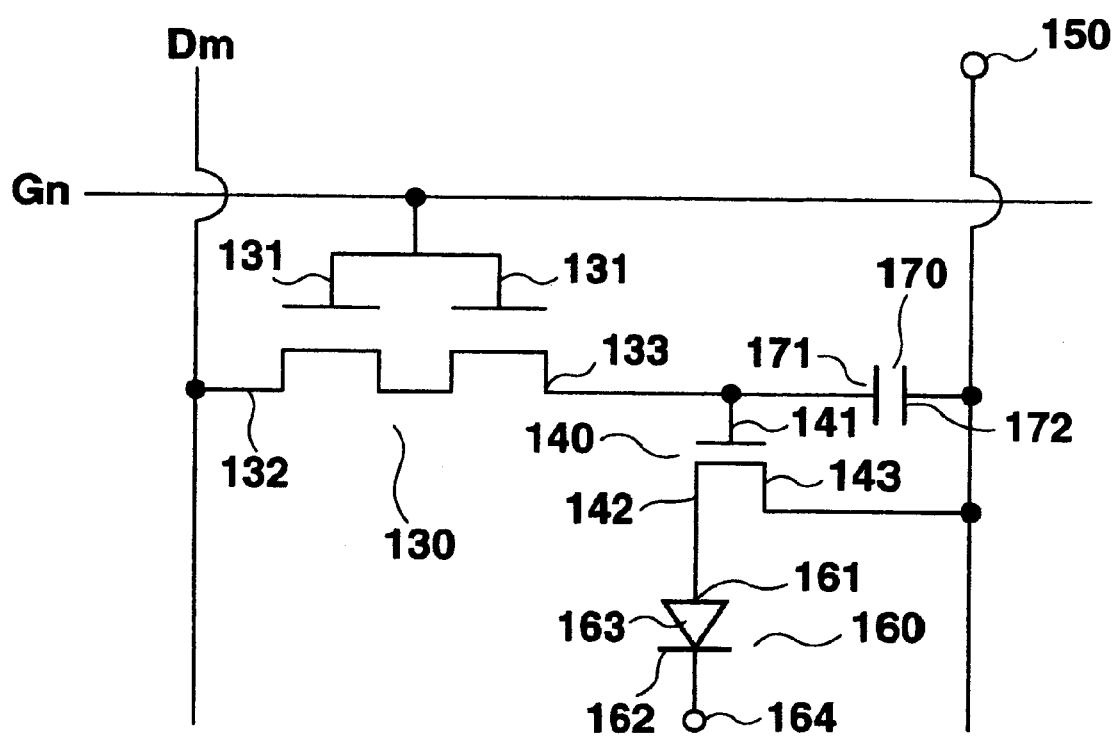
FIG. 1 is an equivalent circuit diagram of related EL display device.
Figure 2:
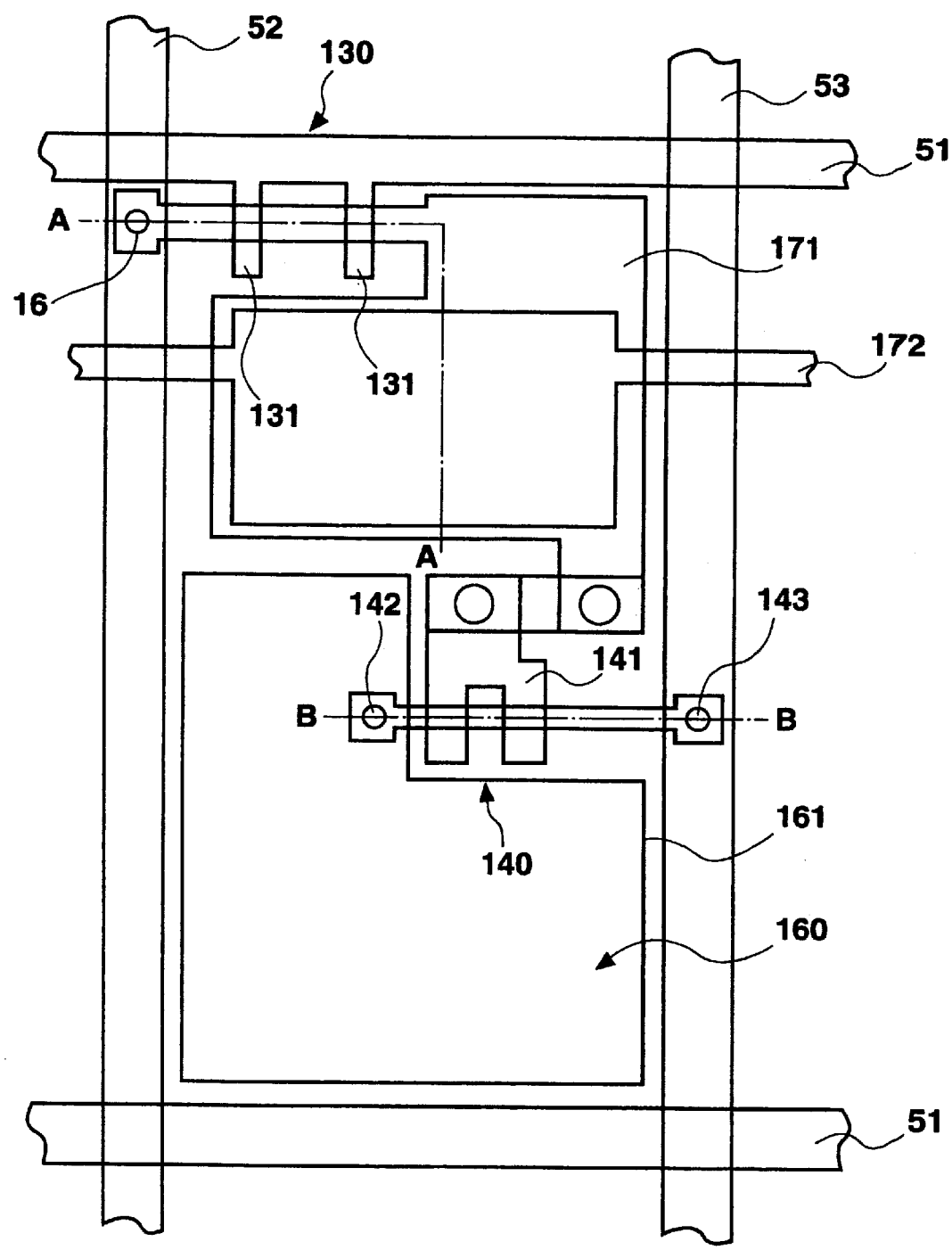
FIG. 2 is a plan view of a related EL display device.
Figure 3A:
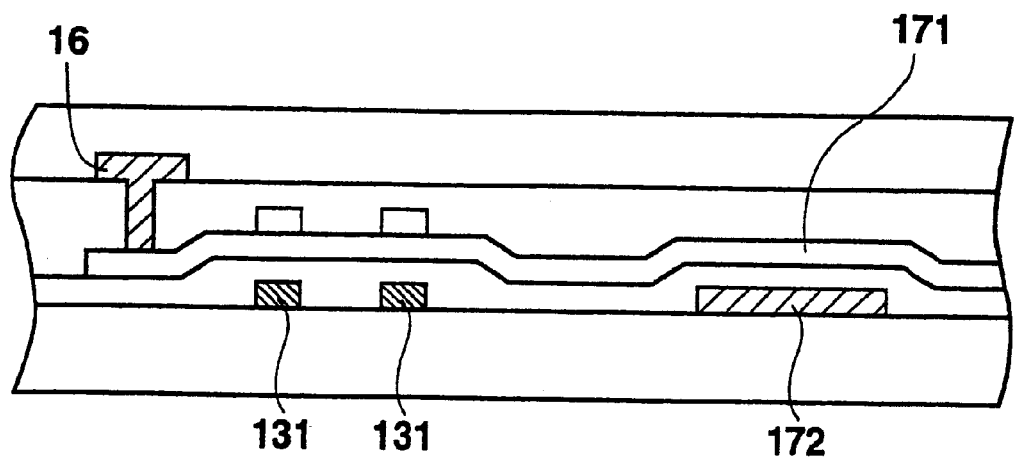
FIGS. 3A and 3B are cross sections of the EL display device shown in FIG. 2.
Figure 3B:
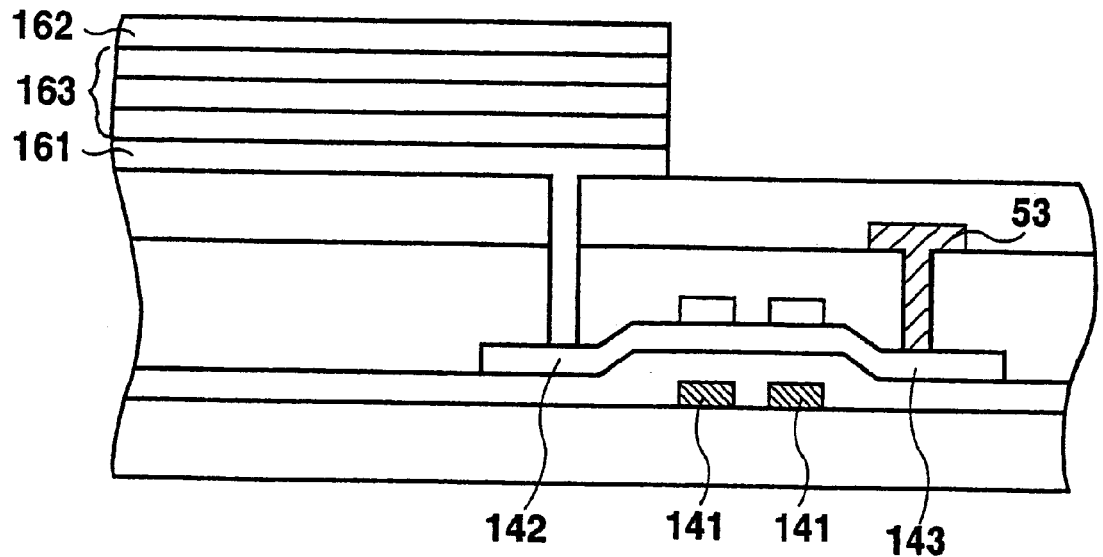
Figure 4:
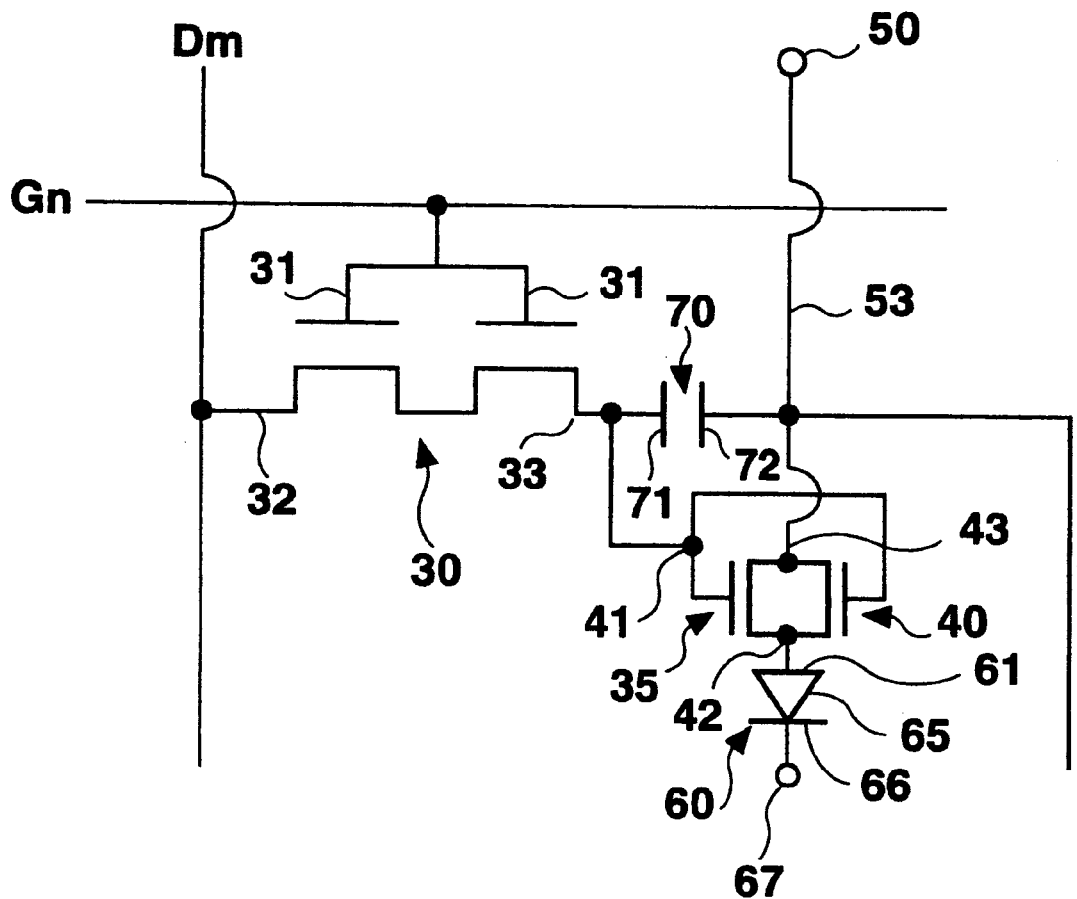
FIG. 4 is an equivalent circuit diagram of an EL display device according to the present invention.
Figure 5:
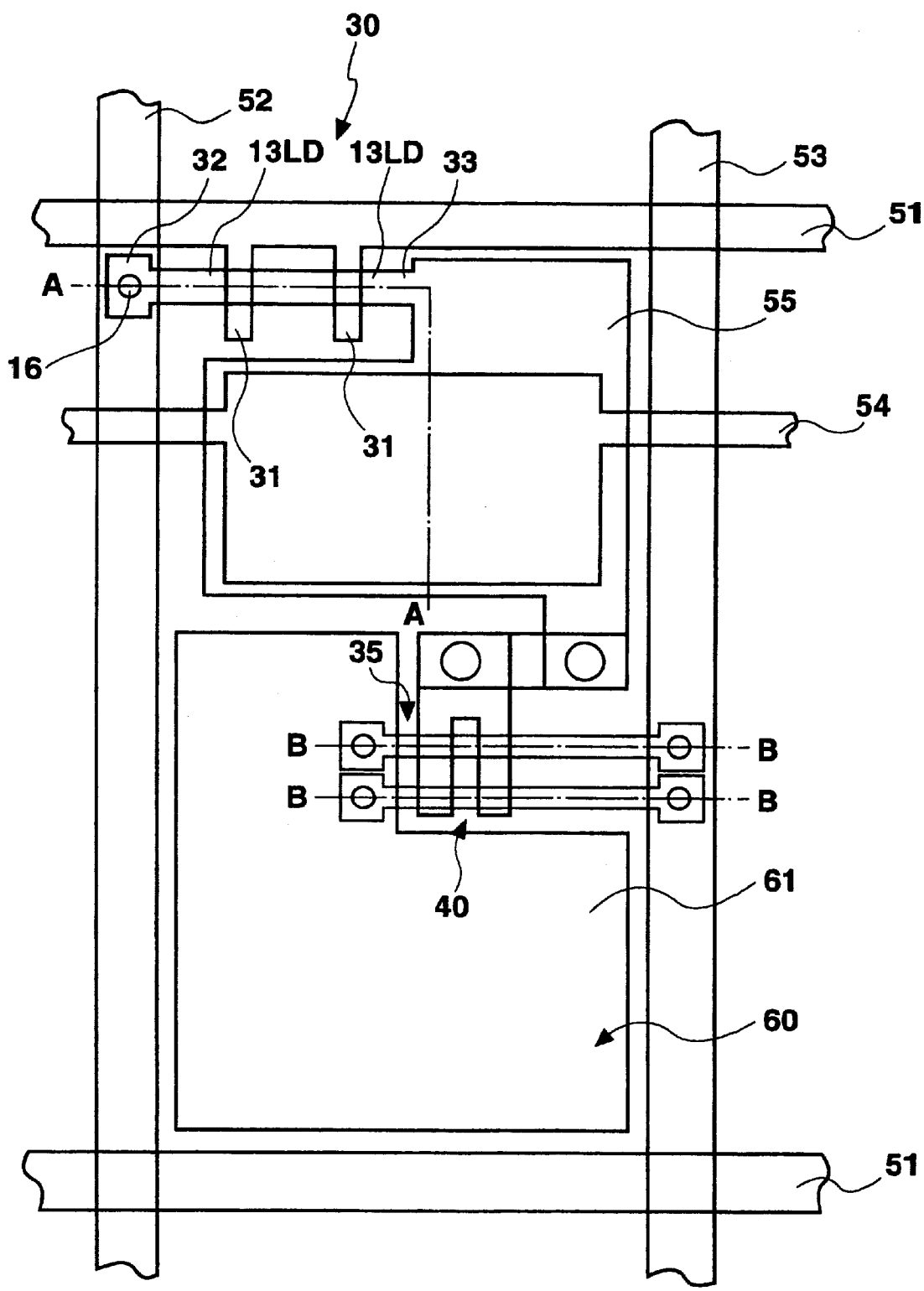
FIG. 5 is a plan view of an EL display device according to the present invention.
Figure 6A:
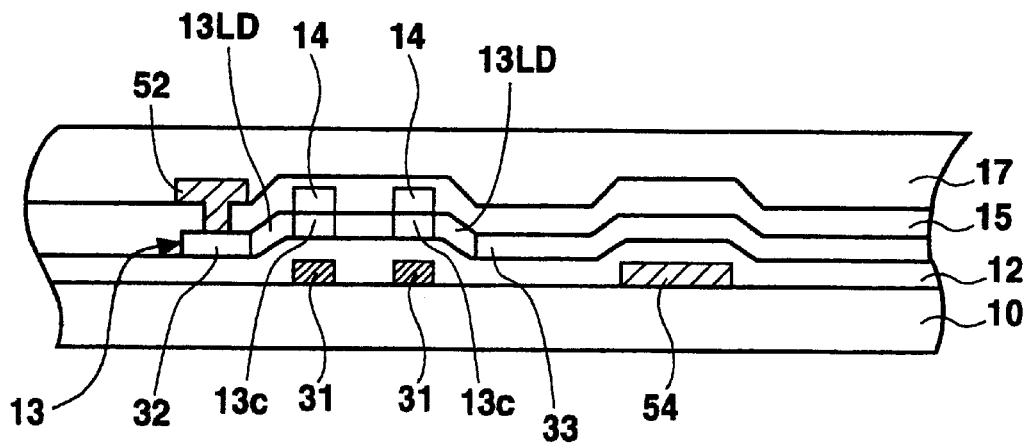
FIGS. 6A and 6B are cross sections of the EL display device according to the present invention shown in FIG. 5.
Figure 6B:
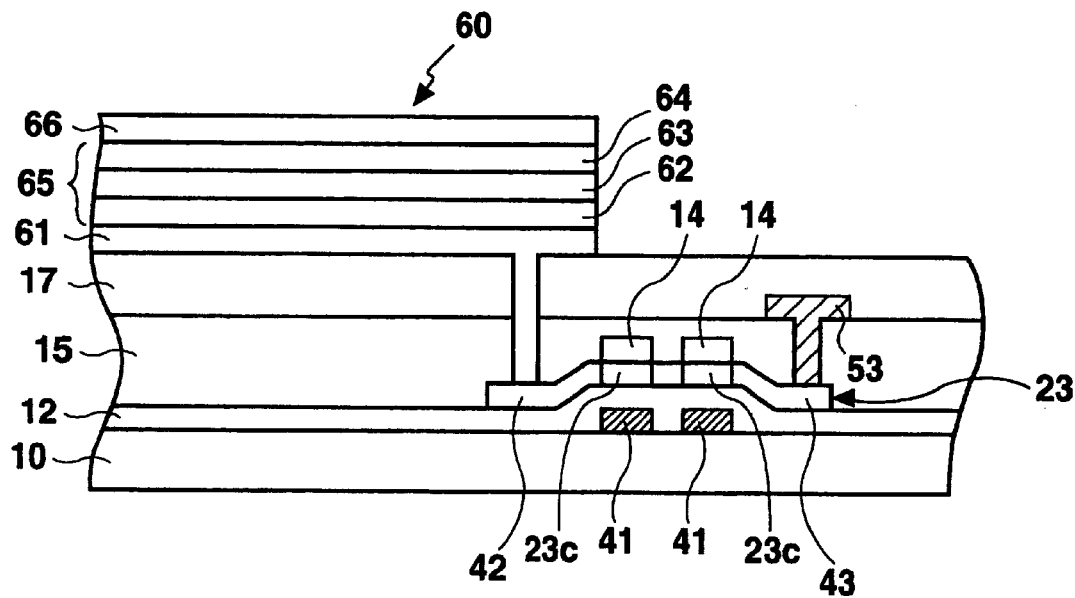

FIG. 4 shows an equivalent circuit diagram of an organic EL display device of the present invention. FIG. 5 shows, in a plan view, one display pixel when the present invention is applied to an organic EL display device, and FIGS. 6A and 6B are cross sections taken along lines A—A and B—B in FIG. 5, respectively.

FIG. 4 is an equivalent circuit diagram of an EL display device comprising a first TFT 30, a second TFT 35, a third TFT 40 and an organic EL element 60, showing one pixel constituted in the vicinity of the region where the gate signal line Gn in the n-th row is orthogonal to the drain signal line Dm in the m-th column. In the vicinity of the cross section of both signal lines are provided the organic EL element 60, and the first, second and third TFTs 30, 35, 40 for controlling the organic EL element 60. The second and third TFTs 35, 40 are electrically connected in parallel.

The first TFT 30, which is a switching TFT (the first transistor), comprises fate electrodes 31 connected to the gate signal line Gn and having a gate signal supplied thereto, a drain 32 connected to the drain signal line Dm and having a drain signal supplied thereto, and a source electrode 33 connected to a gate electrode 41 of the second and third TFTs 35 and 40.

The second and third TFTs 35, 40, which are an organic EL element driving TFT (the second transistor), both comprise a gate electrodes 41 connected to the source electrode 33 of the first TFT 30, a source electrode 42 connected to an anode 61 of the organic EL element 60, and a drain electrode 43 connected to a power supply 50 for the organic EL element 60.

The organic El element 60 comprises the anode 61 connected to the source electrode 42 of the second and third TFTs, a cathode 66 connected to a common electrode 67, and an emissive element film 65 interposed between the anode 61 and the cathode 66.

A storage capacitor 70 is further provided with one electrode 71 being connected between the source electrode 33 of the first TFT 30 and the gate electrodes 41 of the second and third TFTs 35, 40 while the other electrode 72 being connected to a power supply line 53.

When a gate signal is applied to the gate electrodes 31 of the first TFT 30, a drain signal is applied from the drain 32 to the source electrode 33 and is further applied to the storage capacitor 70 and the gate electrodes 41 of the second and third TFTs 35, 40.

Then, when a voltage is applied to the gate electrode 41, an electrical current in accordance with the voltage is supplied from the power supply 50 to the organic EL element 60 which then emits light.

As shown in FIG. 5, a display pixel is formed in a region enclosed by the gate signal line 51 and the drain signal line 52. Around the intersection of both signal lines is formed the first TFT 30 as a switching TFT whose source electrode 33 also functions as a storage capacitor electrode 55 constituting a capacitor between the source electrode 33 and a storage capacity electrode line 54 and is connected to the gate electrodes 41 of the second and third TFT 35, 40. The source electrode 42 of the TFTs 35, 40 is connected to the anode 61 of the organic EL element while the drain electrode 43 is connected the the power supply line 53 for driving the organic EL element.

The storage capacitor electrode line 54 is disposed in parallel to the gate signal line 51 in the vicinity of the first TFT. The storage capacitor electrode line 54 comprises chromium or the like and forms a capacitor for accumulating charges between the storage capacitor electrode line 54 and the storage capacitor electrode 55 connected to the source electrode 33 of the TFT via a gate insulating film 12. The storage capacitor is provided so as to hold a voltage to be applied to the fate electrodes 41 of the second and third TFTs 35, 40.

According to this embodiment, all of the first, second and third TFTs 30, 35, 40 are so-called bottom gate type TFTs in which a gate electrode is disposed under the active layer 13, and in each TFT, a polysilicon (hereinafter referred to a "p-Si") is used as the active layer and the gate electrodes 31, 41 have a double gate structure.

The first TFT 30, which is a switching TFT, will now be described.

As shown in FIG. 6A, on an insulating substrate 10 comprising a quartz glass, non-alkali glass, or the like, are provided the gate signal line 51 including the gate electrodes 31 and comprising a metal having a high melting point (a refractory metal) such as chromium (Cr), molybdenum (Mo), or the like, a drain signal line 52 comprising aluminum (AL), and the power supply line 53 connected to the power supply of the organic EL element and comprising AL.

Subsequent to formation of the gate signal line 51 including the gate electrodes 31 on the substrate 10, a gate insulating film 12, and an active layer 13 comprising a p-Si film are sequentially formed.

The active layer 13 has a so-called LDD (Lightly Doped Drain) structure. Specifically, ions are doped into respective channels 13c on the gate electrodes 31 using each stopper insulating layer 14 formed thereon as a mask, and the gate electrodes 31 are covered with a resist to further dope ions, thereby forming low density regions 13LD at both sides of the channels 23c facing the electrodes pair, and as source electrode 33 and a drain 32 of high density regions to the outsides of the low density regions.

Further, over the entire surface covering the gate insulating film 12, the active layer 13, and the stopper insulating layers 14, an interlayer insulating film 15 formed by sequential accumulation of $SiO_2$ film, SiN film and $SiO_2$ film is provided, and a metal such as Al or the like is used to fill a contact hole formed in the position of the interlayer insulating film 15 corresponding to the drain 32 to from the drain electrode integrally formed with the drain signal line 52. Then, a planarization insulating layer 17 comprising an organic resin and planarization a surface is provided on the entire surface.

Next, the second and third TFTs 35, 40, which are organic EL element driving TFTs, will be described.

As shown in FIG. 6B, on an insulating substrate 10 comprising a quartz glass, non-alkali glass, or the like, the gate electrodes 41 each comprising a refractory metal (metal having a high melting point) such as Cr, Mo, or the like are formed, and a gate insulating film 12 and an active layer 23 comprising a p-Si film are sequentially formed thereon.

The active layer 23, channels 23c which are intrinsic or substantially intrinsic are formed at the positions above the respective gate electrodes 41, and a source electrode 42 and a drain electrode 43 formed by ion doping are also provided at each side of the channel pair.

An interlayer insulating film 15 formed by sequential accumulation of an $SiO_2$ film, SiN film and $SiO_2$ film is provided over the entire surface on the gate insulating film 12 and the active layer 23, and a contact hole in the interlayer insulating film 15 corresponding to the drain electrode 43 is filled with a metal such as Al to form the power supply line 53 connected to the power supply 50.

Further, a planarization insulating film 17 comprising an organic resin to flatten the surface is provided over the entire surface. On the planarization insulating film 17, is provided a transparent electrode, in this case the anode 61 of the organic EL element, which comprises ITO and makes contact with the source electrode 42 via a contact hole formed at the position of the planarization insulating film 17 on the interlayer insulating film 15 corresponding to the source electrode 42.

The organic EL element 60 can adopt a general structure, and may, for example, be constituted as follows. The anode 61 comprising a transparent electrode of ITO (Indium Tin Oxide) or the like, an emissive element film 65 comprising a first hole-transport layer 62 comprising MTDATA (4,4,4-tris(3-methylphenylphenylamino)triphenylamine), a second hole-transport layer 63 comprising TPD (4,4-bis(3-methylphenylphenylamino)biphenyl), an emissive layer 64 comprising $Bebq_2$ (10-benzo[h]quinolinol-berylliuim) including quinacridone derivative, and an electron-transport layer comprising $Bebq_2$, and the cathode 66 comprising magnesium-indium alloy may be accumulated in that order.

In the organic EL element 60, holes injected from the anode and electrons injected from the cathode are recombined inside the emissive layer to excite organic molecules forming the emissive layer for causing exciton. In the process of radiation and deactivation by the exciton, the emissive layer produces light which is emitted from the transparent anode through the transparent insulating substrate.

Next, the TFTs for driving the organic EL element will be further described using an example wherein TFTs for driving the organic EL element of each display pixel cause a current having a current value i to flow.

When only one TFT is provided for driving the organic EL element as in the related art, some of the organic EL elements in display pixels have lower luminance when, for example, the on-state currents vary in the TFT and are therefore low. In other words, if the current value reduces to i/2, a half of i, due to the variation in the characteristics, the luminance of the organic EL element is also halved.

However, when two TFTs are provided in each display pixel for driving the organic EL element as in the present invention, the direct effects of variation in the characteristics of the TFT upon the entire current applied to the organic EL element, which is notable in the related art, can be avoided even when, for example, the characteristics vary in one of the TFTs and lower the on-state current. Namely, even if the current value in one of the two TFTs is i/2 with regard to the target current value of i, the whole total value flowing in the organic EL element by the two TFTs is 3i/2. Thus, it is possible to suppress the effects by the variation in the characteristics of the TFT upon the total current value applied to the organic EL element.

Accordingly, reduction in luminescence of each display pixel is suppressed even when the characteristics of the TFTs driving the organic EL element in each display pixel vary.

Although a p-Si film is used as an active layer in the above example, a microcrystal silicon film or an amorphous silicon film may also be used.

Also, while the above embodiment was based on a description in which the second transistor comprises two TFTs connected in parallel, the present invention is not limited to such an embodiment and can, for example, be applied to a case wherein three or more TFTs are connected in parallel.

Further, although the description of the above embodiment featured an organic EL display device, the present invention is not limited thereto and can provide similar effects when applied to an inorganic EL display device having an emissive layer comprising an inorganic material, or to a vacuum fluorescent display (VFD) having an emissive layer comprising a fluorescent material between two electrodes.

In the foregoing embodiment, the first TFT 30 which is a switching TFT, and the second and third TFTs 35, 40 for driving the EL element are formed in the same process step. More specifically, on the substrate 10, the gate electrodes 31, 41 are formed, then the gate insulating film 12 is formed, and a non-single crystal silicon layer (polysilicon layer) constituting the active layers 13, 23 are formed, before further forming a structure required for a transistor. As the active layers 13, 23, a polysilicon layer obtained by applying polisilicon process such as laser annealing to an amorphous silicon layer already formed can be used. However, due to the variation in conditions of this annealing process, the characteristics of the element driving TFTs may also vary. In the embodiment, due to the element driving TFTs constituted by a plurality of TFTs connected in parallel to each other, variations in each TFT caused by the variations in such manufacture conditions may be suppressed entirely. Also, by forming the transistors, especially the active layers thereof, in the same process step, no specific or additional step is necessary and only patterning of the layer such that the non-signal crystal silicon layer remains in the desired region is required, even when a plurality of element driving thin film transistors are arranged and connected in parallel.

As described above, the storage capacitor 70 is connected between the source of the first TFT and each gate of the second and third TFTs 35, 40. In the described embodiment, especially the capacitor electrode 55 of this capacitor 70 is formed by widely extending the polysilicon layer constituting the active layer 13 of the first TFT 30 within one pixel. Accordingly, no step specifically for forming the capacitor electrode 55 is not required.

While the preferred embodiment of the present invention has been described using specific terms, such description is for illustrative purposes only, and it is to be understood that changes and variations may be made without departing from the spirit or scope of the appended claims.

What is claimed is:

1. An electroluminescence display device comprising:
   an electroluminescence element having an anode, a cathode and an emissive layer interposed between the anode and the cathode;
   a first transistor formed by a thin film transistor in which a drain of an active layer using a non-single crystal semiconductor film is connected to a drain signal line, and gate electrodes provided above or under channels of said active layer are connected to a gate signal line; and
   a second transistor formed by a plurality of thin film transistors in each of which a drain of an active layer using a non-single crystal semiconductor film is connected to a power supply of said electroluminescence element a source of said active layer is connected to said electroluminescence element, and gate electrode is connected in parallel with the source of the first thin film transistor.

2. An electroluminescence display device of claim 1, wherein said non-single crystal semiconductor layer is a polysilicon layer.

3. An electroluminescence display device of claim 1, wherein the thin film transistor constituting said first transistor has a Lightly Doped Drain structure and/or a multi gate structure.

4. An electroluminescence display device of claim 1, wherein the active layers of said thin film transistor constituting the first transistor and of said thin film transistors constituting the second transistor are non-single crystal semiconductor layers formed in the same process step.

5. An electroluminescence display device of claim 1, wherein said electroluminescence element is an organic electroluminescence element having an emissive layer which uses an organic compound.

6. An electroluminescence device comprising:
   an electroluminescence element having first and second electrodes and an emissive layer provided between the first and second electrodes;
   a switching thin film transistor which operates when a gate thereof receives a gate signal, to capture a data signal; and
   an element driving thin film transistor provided between a power supply and the electroluminescence element for controlling a power to be supplied from the power supply to the electroluminescence element according to the data signal supplied from the switching thin film transistor, said element driving thin film transistor being constituted by a plurality of thin film transistors connected in parallel.

7. An electroluminescence device of claim 6, wherein a non-single crystal semiconductor layer is used for the active layer in each of said switching thin film transistor and said element driving thin film transistor.

8. An electroluminescence device of claim 6, wherein the active layers of said switching thin film transistor and of said element driving thin film transistor are non-single crystal semiconductor layers formed in the same process step.

9. An electroluminescence device of claim 6, wherein said electroluminescence element, and said switching and element driving thin film transistors constitute one pixel of the device, and a plurality of said pixels are arranged in a matrix on a substrate.

10. An electroluminescence device of claim 6, further comprising a storage capacitor connected between the source of said switching thin film transistor and each gate of the plurality of thin film transistors constituting said element driving thin film transistor.

11. An electroluminescence device of claim 6, wherein said electroluminescence element is an organic electroluminescence element having an emissive layer which uses an organic compound.

12. An electroluminescence device of claim 6, wherein said switching and element driving thin film transistors have a top gate or bottom gate structure in which the gate electrodes are disposed above or under the active layer of each transistor.

13. An electroluminescence device of claim 6, wherein said switching thin film transistor has a Lightly Doped Drain structure and/or a multi-gate structure.

14. A light emissive device comprising:
   a light emissive element having first and second electrodes and an emissive layer provided between the first and second electrodes;
   a switching thin film transistor which operates when a gate thereof receives a gate signal, to capture a data signal; and
   an element driving thin film transistor provided between a power supply and the light emissive element for controlling a power to be supplied from the power supply to the light emissive element according to the data signal supplied from the switching thin film transistor, said element driving thin film transistor being constituted by a plurality of thin film transistors connected in parallel.

* * * * *

UNITED STATES PATENT AND TRADEMARK OFFICE
CERTIFICATE OF CORRECTION

PATENT NO. : 6,501,448 B1 Page 1 of 1
APPLICATION NO. : 09/493893
DATED : December 31, 2002
INVENTOR(S) : Naoaki Komiya et al.

It is certified that error appears in the above-identified patent and that said Letters Patent is hereby corrected as shown below:

Column 1:
Line 13, before "electroluminescence", delete "An";

Column 2:
Line 32, after "drive", delete "souse" and insert therefor --source--;

Column 5:
Line 2, after "TFT", insert --30--;
Line 4, before "electrodes", delete "fate" and insert therefor --gate--;
Line 30, after "31", insert --and regions at both sides of the electrodes pair a
  predetermined distance from each gate electrode 31--;
Line 32, after "and", delete "as" and insert therefor --a--;
Line 41, after "32", delete "to";

Column 7:
Line 27, before "crystal", delete "non-signal" and insert therefor --non-single--.

Signed and Sealed this

Twenty-sixth Day of June, 2007

JON W. DUDAS
*Director of the United States Patent and Trademark Office*